(12) United States Patent
Wong et al.

(10) Patent No.: US 7,466,162 B2
(45) Date of Patent: Dec. 16, 2008

(54) ELECTRONIC LOAD

(75) Inventors: Shih-Fang Wong, Taipei Hsien (TW); Tsung-Jen Chuang, Taipei Hsien (TW); Jun Li, Shenzhen (CN)

(73) Assignees: Hong Fu Jin Precision Industry (Shenzhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/770,748

(22) Filed: Jun. 29, 2007

(65) Prior Publication Data

US 2008/0150547 A1    Jun. 26, 2008

(30) Foreign Application Priority Data

Dec. 22, 2006    (CN) .................. 2006 1 0157880

(51) Int. Cl.
    *G01R 31/36* (2006.01)
(52) U.S. Cl. ........................................ 324/771
(58) Field of Classification Search .............. 324/158.1, 324/771

See application file for complete search history.

(56) References Cited

U.S. PATENT DOCUMENTS

| 4,037,156 | A | * | 7/1977 | Goujon et al. | ............... 324/771 |
| 6,118,674 | A | * | 9/2000 | Higashi | ..................... 363/71 |
| 6,861,835 | B2 | * | 3/2005 | Maly et al. | ............... 324/140 R |
| 2003/0075732 | A1 | * | 4/2003 | Franke et al. | ............... 257/200 |
| 2007/0019347 | A1 | * | 1/2007 | Tseng et al. | ................... 361/90 |

* cited by examiner

*Primary Examiner*—Ha Tran T Nguyen
*Assistant Examiner*—Shaun Campbell
(74) *Attorney, Agent, or Firm*—Frank R. Niranjan

(57) ABSTRACT

An electronic load includes a current control circuit and an interface circuit. The current control circuit is used for receiving a voltage, and outputting a measured current. The interface circuit is coupled to the current control circuit, for receiving the measured current, and providing an interface for instruments. The current control circuit and the interface circuit are coupled to a power supply being tested.

17 Claims, 2 Drawing Sheets

ELECTRONIC LOAD

BACKGROUND OF THE INVENTION

1. Field of the Invention

The present invention generally relates to electronic loads, and more particularly to electronic loads for testing power supplies.

2. Description of Related Art

It is often necessary to use particular load circuits to simulate operations of loads during design and production of power supplies. The particular loads circuits are able to simulate the operations of the loads in ways of voltage and current levels that vary with time, temperature, and other conditions.

There are various kinds of load circuits. A first kind of load circuit is composed of passive devices like resistors, capacitors, inductors, and so on. When using the first kind of load circuit, it is often difficult to adjust parameters of the load circuit. On the other hand, performance of the load circuit tends to be influenced by environmental conditions such as temperature and humidity.

A second kind of load circuit is composed of active devices like chips, transistors, diodes, etc. When using the active devices as load circuits, it is easier to adjust the parameters of the load circuits than that of the passive devices as load circuits, and performance is more stable than that of the first kind of load circuit. However, cost and power consumption of the electronics loads increase greatly when incorporating the electronic devices, such as the single chip machines, etc.

Therefore, it is an aim of the present invention to provide a kind of electronic loads with lower costs and lower power consumptions.

SUMMARY OF THE INVENTION

An electronic load includes a current control circuit and an interface circuit. The current control circuit is used for receiving a voltage, and outputting a measured current in control. The interface circuit is coupled to said current control circuit, for receiving said measured current, and providing an interface for instruments. The current control circuit and the interface circuit are coupled to a power supply under test.

A system for testing a power supply includes a power supply under test, a load module, and an instrument. The load module is coupled to the power supply, for testing the power supply. The load module includes a current control circuit and a interface circuit. The current control circuit is configured for outputting a measured current to the interface circuit in control of a control voltage. The instrument is coupled to the interface circuit.

Other systems, methods, features, and advantages of the present electronic load will be or become apparent to one with skill in the art upon examination of the following drawings and detailed description. It is intended that all such additional systems, methods, features, and advantages be included within this description, be within the scope of the present system and method, and be protected by the accompanying claims.

BRIEF DESCRIPTION OF THE DRAWINGS

Many aspects of the present electronic loads can be better understood with reference to the following drawings. The components in the drawings are not necessarily to scale, emphasis instead being placed upon clearly illustrating the principles of the inventive system and method. Moreover, in the drawings, like reference numerals designate corresponding parts throughout the several views.

DETAILED DESCRIPTION OF THE INVENTION

Reference will now be made to the drawings to describe a preferred embodiment of the inventive electronic load.

Figure 1:
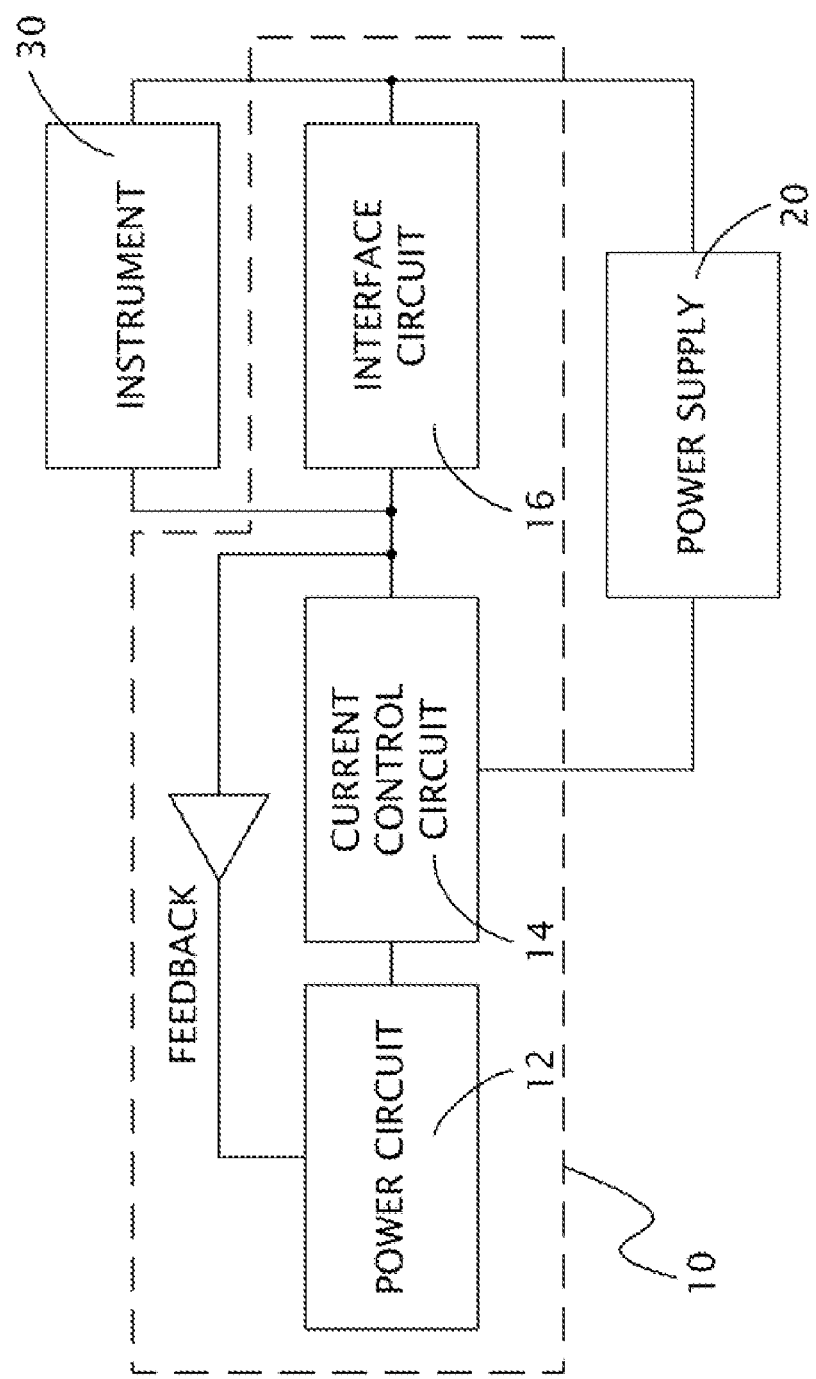
FIG. 1 is a block diagram of an electronic load in accordance with an exemplary embodiment.

Referring to FIG. 1, a block diagram of an electronic load in accordance with an exemplary embodiment is illustrated. The electronic load 10 is incorporated in a working state where a power supply 20 and an instrument 30 are coupled to the electronic load 10. The power supply 20 is a to-be-tested object. The instrument 30 is used for measuring key parameters, such as current or voltage levels, thus determining performance of the power supply 20.

The electronic load 10 includes a power circuit 12, a current control circuit 14, and an interface circuit 16. The power circuit 12 is used for providing a stable voltage to follow-up circuits, such as the current control circuit 14 and the interface circuit 16. The current control circuit 14 and the interface circuit 16 are connected in series to be coupled between an anode and a cathode of the power supply 20 when connecting the power supply 20 to the electronic load 10. The current control circuit 14 is used for outputting signals at controllable current levels. The signals are also fed back to the power circuit 12. The interface circuit 16 is configured for providing an interface for the instrument 30.

Figure 2:
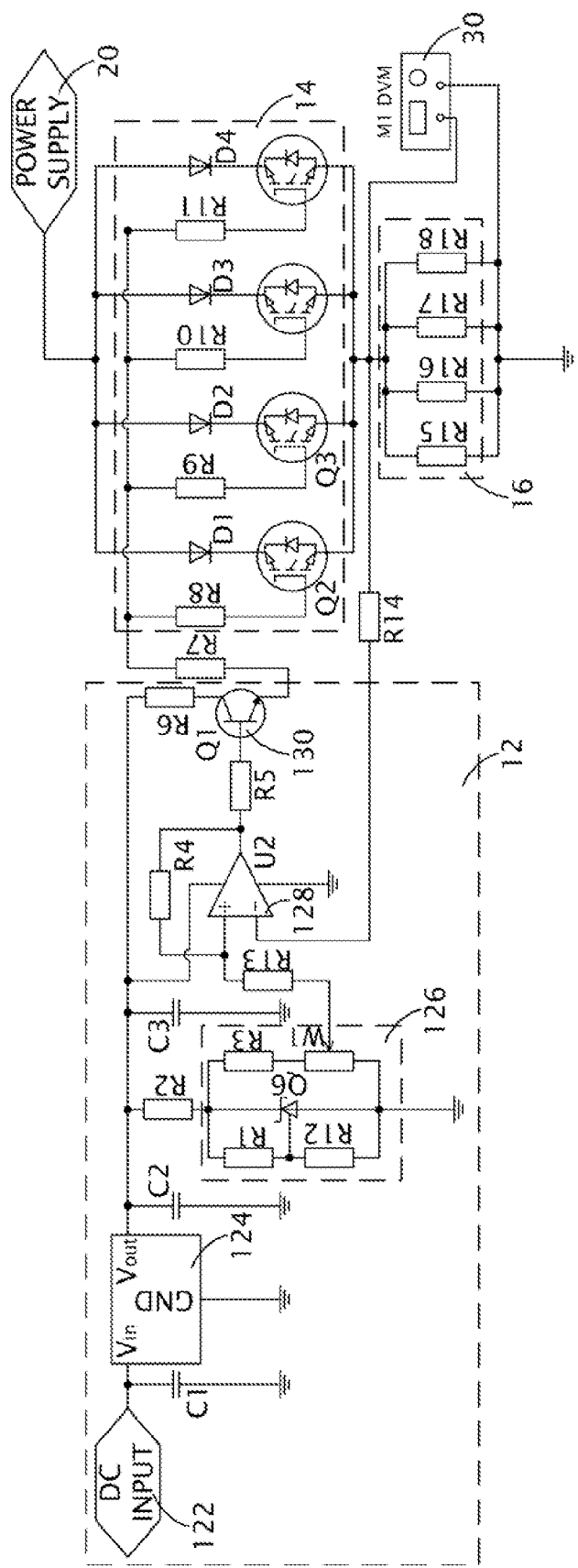
FIG. 2 is an electrical schematic diagram of the electronic load according to the present invention.

Referring to FIG. 2, an electrical schematic diagram of the electronic load 10 with the power supply 20 and the instrument 30 according a exemplary embodiment is illustrated. The power circuit 12 includes a DC input 122, a voltage-stabilize unit 124, a voltage-adjust unit 126, an amplifier unit 128, and a switch unit 130.

The DC input 122 is configured for coupling with an external DC voltage supplier (not shown), and receiving a DC voltage from the external DC voltage supplier. The DC input 122 thus provides a DC output voltage.

The voltage-stabilize unit 124 is connected to the DC input 122, for stabilizing the DC output voltage from the DC input 122 by filtering out ripples in the DC output voltage. The voltage-stabilize unit 124 thus outputs a stabilized voltage. Preferably, the voltage-stabilize unit 124 is a common voltage regulator, such as an LM7812 monolithic regulator, and is able to output a stable positive voltage of 12V.

The voltage-adjust unit 126 is configured for receiving the stabilized voltage outputted by the voltage-stabilize unit 124. The voltage-adjust unit 126 is operable to output an adjusted voltage. The voltage-adjust unit 126 mainly includes two shunts. A first shunt is a combined serial connection of two resistors R1 and R12. A second shunt is a combined serial connection of a resistor R3 and a rheostat W1. An end of each of the shunts is connected to the voltage-stabilize unit 124 through a current-limit resistor R2, the other end of each of the shunts is connected to ground.

The voltage-adjust unit 126 also includes an adjustable shunt regulator Q6, the adjustable shunt regulator Q6 is connected in parallel with the two shunts. A reference end of the adjustable shunt regulator Q6 is connected to a node between the resistors R1 and R12. The adjustable shunt regulator Q6 has an anode and a cathode, the anode of the adjustable shunt regulator Q6 is connected to ground, and the cathode of the adjustable shunt regulator Q6 is connected to the voltage-stabilize unit 124 through a current-limit resistor R2.

An outputted voltage of the adjustable shunt regulator Q6 is applied to the second shunt. The outputted voltage of the adjustable shunt regulator Q6 may be different according to the resistances of resistors R1 and R12. As the outputted voltage is applied to the second shunt, the voltage-adjust unit 126 is able to continuously output the adjusted voltage while tuning the rheostat W1.

Preferably, the adjustable shunt regulator Q6 is an LM431 three terminal adjustable precision zener shunt regulator with an internal reference voltage therein. The outputted voltage of the LM431 three terminal adjustable precision zener shunt regulator is determined by an equation:

$$U_o = V_R \times \left(1 + \frac{R_1}{R_{12}}\right),$$

wherein $U_o$ refers to the outputted voltage of the LM431 three terminal adjustable precision zener shunt regulator, $V_R$ refers to the internal reference voltage, and $R_1$ and $R_{12}$ refer to the resistance of the resistors R1 and R12 respectively. Commonly, the internal reference voltage is 2.5V.

The amplifier unit 128 has a non-inverting input and an inverting input. The non-inverting input of the amplifier unit 128 is connected with the voltage-adjust unit 126 and configured for receiving the adjusted voltage. The inverting input of the amplifier unit 128 is connected to an output end of the current control circuit 14. Preferably, the amplifier unit 128 is an operational amplifier (OP-AMP) U2. The adjusted voltage is inputted to the non-inverting input of the OP-AMP U2 as a reference voltage, and an amplified voltage is outputted by the OP-AMP U2. The amplified voltage operates as a switch voltage for the switch unit 130.

A preferred embodiment of the switch unit 130 is a bipolar junction transistor (BJT) Q1. The BJT Q1 has three terminals, a base, a collector, and an emitter. The base of the BJT Q1 is coupled to the output of the amplifier unit 128 through a resistor R5. The collector of the BJT Q1 is electrically connected to the output end of the voltage-stabilize unit 1124 through a resistor R6. The emitter of the BJT Q1 is coupled to a control terminal of the current control circuit 14. As the amplified voltage is applied to the base of the BJT Q1, when the amplified voltage drives the BJT Q1 to be conductive, the emitter sends a control voltage to the current control circuit 14. Similarly, the switch unit 130 may be other switch devices, such as a field effect transistor (FET).

The current control circuit 14 includes a plurality of branches connected in parallel with each other. Each branch has a power transistor connected therein. The power transistors can be chosen from power Metal Oxide Semiconductor Field Effect Transistor (power MOSFET), Insulated Gate Bipolar Transistor (IGBT), and so on. In the following description, an IGBT will be used as an example of the power transistor.

In the current control circuit 14, each branch includes an IGBT, a resistor, and a diode. A branch including the IGBT Q2, the resistor R8, and the diode D1 is going to be described as an example. The IGBT Q2 has a gate terminal, a drain terminal, and a source terminal. The gate terminal is coupled to the output of the switch unit 130 through the resistor R8 and a resistor R7. More precisely, the gate terminal is coupled to the emitter of the BJT Q1 through the resistor R8 and the couple resistor R7. The drain terminal of the IGBT Q2 is connected to the power supply 20 that is going to be tested through the diode D1. The diode D1 has an anode connected to the power supply 20 and a cathode connected to the drain terminal of the IGBT Q2. The source terminal of the IGBT Q2 is connected to the interface circuit 16, for outputting a measured current to the interface circuit 16. The current control circuit 14 may output the measured current at different levels by using different power transistors.

The IGBTs have high voltage endurances against high voltages. The high voltage may be up to hundreds or thousands of volts. The electronic load 10 may thus be able to work under a broad-range of voltages. As the IGBTs have good linearity when being turned on, the electronic load 10 may also have good linearity.

The interface circuit 16 is connected between the current control circuit 14 and the power supply 20. Preferably, the interface circuit 16 has a plurality of shunt resistors R15, R16, R17, R18 . . . that are connected in parallel with each other. The shunt resistors shunt the measured current outputted by the current control circuit 14. As an example, the shunt resistors R15, R16, R17, R18 . . . have a same resistance. When the instrument 30 is coupled to the two ends of the interface circuit 16, the voltage on the interface circuit 16 can be measured. Since the current control circuit 14 and the interface circuit 16 are coupled to the power supply 20 as the load, and the current control circuit 14 has good linearity, the current characteristic, the voltage characteristic, and the power characteristic may be easily calculated.

The electronic load 10 may be adjusted easily by choosing proper power transistors in the current control circuit 14 and shunt resistors in the interface circuit 16. The switch unit 130 may be switched on or off by tuning the rheostat W1. The electronic load 10 can test the power supply 20 without using a single chip machine, thus saving power and cost. The electronic load 10 may also be used as a module to be further integrated with other functional modules, to perform more functions.

What is claimed is:

1. An electronic load comprising:
a current control circuit for receiving a control voltage and outputting a controllable measured current, the controllable measured current being variable by adjusting the control voltage, the current control circuit comprising a plurality of power transistors each associated with a diode, each of the power transistors comprising a gate terminal for receiving the control voltage, a drain terminal being coupled to a power supply by the corresponding diode, and a source terminal for outputting the measured current; and
an interface circuit coupled to said current control circuit, for receiving said measured current, and passively providing an interface for instruments;
wherein the current control circuit and the interface circuit are coupled to the power supply being tested.

2. The electronic load as claimed in claim 1, wherein an anode of each diode is connected to the power supply being tested, and a cathode of each diode is connected to the drain terminal of the corresponding power transistor.

3. The electronic load as claimed in claim 1, wherein the power transistor is either a power metal oxide semiconductor field effect transistor or an insulated gate bipolar transistor.

4. The electronic load as claimed in claim 1, wherein the electronic load further comprises a power circuit for outputting the control voltage to the current control circuit; the power circuit comprises serially connected a DC input, a voltage-adjust unit and a switch unit; the DC input is configured for coupling with an external DC voltage supplier, and receiving a DC voltage from the external DC voltage supplier; the voltage-adjust unit is configured for outputting an adjusted voltage under adjustment; and the switch unit is used for outputting the control voltage to the current control circuit at the occurrence that the switch unit is switched on.

5. The electronic load as claimed in claim 4, wherein the switch unit is either a bipolar junction transistor or a field effect transistor.

6. The electronic load as claimed in claim 4, wherein the voltage-adjust unit comprises a rheostat, the voltage-adjust unit outputs the adjusted voltage of the rheostat.

7. The electronic load as claimed in claim 6, wherein the voltage-adjust unit further comprises an adjustable shunt regulator, an outputted voltage of the adjustable shunt regulator is applied to the rheostat.

8. The electronic load as claimed in claim 4, wherein the power circuit further comprises a voltage-stabilize unit coupled to the DC input, for filtering out ripples in the DC voltage, and outputting a stabilized voltage to the voltage-adjust unit.

9. A system comprising:
   a power supply being tested;
   a load module coupled to the power supply, for testing the power supply, the load module comprising a current control circuit and an interface circuit, the current control circuit comprising a plurality of power transistors each associated with a diode, each of the power transistors comprising a gate terminal for receiving a control voltage, a drain terminal being coupled to the power supply by the corresponding diode, and a source terminal for outputting a variable measured current; and
   an instrument coupled to the interface circuit;
   wherein the current control circuit is configured for outputting the variable measured current to the interface circuit in control of the control voltage.

10. The system as claimed in claim 9, wherein the system further comprises a power circuit for outputting the control voltage, the power circuit comprises serially connected a voltage-adjust unit and a switch unit; the voltage-adjust unit is configured for outputting an adjusted voltage under adjustment; and the switch unit is used for outputting the control voltage to the current control circuit at the occurrence that the switch unit is switched on.

11. The system as claimed in claim 10, wherein the power circuit further comprises a DC input and a voltage-stabilize unit coupled to the DC input, the DC input is configured for being coupled to an external DC voltage supplier, and receiving a DC voltage from the external DC voltage supplier; the voltage-stabilize unit is used for stabilizing the DC voltage, and outputting a stabilized voltage to the voltage-adjust unit.

12. The system as claimed in claim 10, wherein the power circuit further comprises a DC input and a voltage-stabilize unit coupled to the DC input, the DC input is configured for being coupled to an external DC voltage supplier, and receiving a DC voltage from the external DC voltage supplier; the voltage-stabilize unit is used for stabilizing the DC voltage, and outputting a stabilized voltage to the voltage-adjust unit.

13. The system as claimed in claim 10, wherein the voltage-adjust unit comprises a rheostat, the rheostat is used for being tuned, thus the voltage-adjust unit is able to output the adjusted voltage.

14. The system as claimed in claim 13, wherein the voltage-adjust unit further comprises an adjustable shunt regulator, an outputted voltage of the adjustable shunt regulator is applied to the rheostat.

15. The system as claimed in claim 9, wherein the current control circuit comprises at least one branch comprising at least one power transistor; a source terminal of the at least one power transistor is configured for outputting the measured current to the interface circuit; a drain terminal of the at least one power transistor is connected to the power supply being tested through a diode, an anode of the diode is connected to the power supply being tested, and a cathode of the diode is connected to the drain terminal of the at least one power transistor; and a gate terminal of the at least one power transistor is configured for being coupled to the control voltage.

16. An electronic load for being coupled to a power supply being tested, the electronic load comprising:
   a current control circuit coupled to the power supply, the current control circuit capable of receiving a power supplied from the power supply, measuring the received power, and outputting a measured current corresponding to the received power; and
   a power circuit coupled to the current control circuit, the power circuit comprising serially connected a DC input, a voltage-adjust unit, an amplifier unit, and a switch unit in that order, the DC input being coupled to an external DC voltage supplier, and receiving a DC voltage from the external DC voltage supplier, the voltage-adjust unit outputting an adjusted first voltage to the amplifier unit, the amplifier unit comprising two inputs respectively receiving the adjusted first voltage and a second voltage derived from the measured current, and an output outputting an amplified voltage to the switch unit, the switch unit capable of outputting a control voltage to the current control circuit at the occurrence that the switch unit is switched on.

17. The electronic load as claimed in claim 16, wherein the current control circuit comprises a plurality of power transistors each associated with a diode, each of the power transistors comprises a gate terminal for receiving the control voltage, a drain terminal coupled to the power supply by a corresponding diode, and a source terminal for outputting the measured current.

* * * * *